(12) United States Patent
Perktold et al.

(10) Patent No.: US 10,615,753 B2
(45) Date of Patent: Apr. 7, 2020

(54) AMPLIFIER CIRCUIT FOR AMPLIFYING AN OUTPUT SIGNAL OF A CAPACITIVE SENSOR

(71) Applicant: ams AG, Unterpremstätten (AT)

(72) Inventors: Lukas Perktold, Hinwil (CH); Mark Niederberger, Einsiedeln (CH); René Scheuner, Winterthur (CH)

(73) Assignee: ams AG, Unterpremstätten (AT)

(*) Notice: Subject to any disclaimer, the term of this patent is extended or adjusted under 35 U.S.C. 154(b) by 0 days.

(21) Appl. No.: 16/073,315

(22) PCT Filed: Jan. 10, 2017

(86) PCT No.: PCT/EP2017/050416
§ 371 (c)(1),
(2) Date: Jul. 26, 2018

(87) PCT Pub. No.: WO2017/129396
PCT Pub. Date: Aug. 3, 2017

(65) Prior Publication Data
US 2019/0036490 A1 Jan. 31, 2019

(30) Foreign Application Priority Data

Jan. 27, 2016 (EP) ..................... 16152957

(51) Int. Cl.
*H03F 13/00* (2006.01)
*H03F 1/30* (2006.01)
(Continued)

(52) U.S. Cl.
CPC ............ *H03F 1/301* (2013.01); *H03F 1/342* (2013.01); *H03F 1/42* (2013.01); *H03F 3/181* (2013.01);
(Continued)

(58) Field of Classification Search
CPC .......... H03F 1/34; H03F 1/42; H03F 2200/03; H03F 2200/36; H03F 2200/42; H03F 13/00
(Continued)

(56) References Cited

U.S. PATENT DOCUMENTS 7,049,729 B2 * 5/2006 Kashiwase ............ G01L 23/222
123/395
8,913,762 B2 12/2014 Steele et al.
2013/0051582 A1 2/2013 Kropfitsch et al.

FOREIGN PATENT DOCUMENTS

EP 2824832 A1 1/2015
EP 2849337 A1 3/2015

OTHER PUBLICATIONS van den Boom, J.: "A 50?W Biasing Feedback Loop with 6ms Settling Time for a MEMS Microphone with Digital Output" 2012 IEEE International Solid-State Circuits Conference; Feb. 21, 2012; Session 11, Sensors & Mems 11.3; pp. 200-202.

* cited by examiner

*Primary Examiner* — Steven J Mottola
(74) *Attorney, Agent, or Firm* — Fish & Richardson P.C.

(57) ABSTRACT

An amplifier circuit (AC) for amplifying an output signal (OS) of a capacitive sensor (M) comprises a first input terminal (AIN) to receive the output signal (OS) of the capacitive sensor (M) and a second input terminal (BIN) to receive a bias voltage (Vbias) of the capacitive sensor (M). The amplifier circuit (AC) comprises an amplifier (A) for amplifying the output signal (OS) and a control circuit (CF) arranged in a feedback loop (FL) of the amplifier (A) being configured to control a DC voltage level at an input connection (A1) of the amplifier (A). A bias voltage sensing circuit (BVS) senses a change of the level of the bias voltage (Vbias) at the second input terminal (BIN) and changes the (Continued)

bandwidth of the feedback loop (FL) in dependence on the sensed change of the level of the bias voltage (Vbias).

15 Claims, 4 Drawing Sheets

(51) Int. Cl.
  *H03F 1/42* (2006.01)
  *H03F 3/181* (2006.01)
  *H04R 3/00* (2006.01)
  *H04R 19/04* (2006.01)
  *H03F 1/34* (2006.01)

(52) U.S. Cl.
  CPC ............... *H04R 3/00* (2013.01); *H04R 19/04* (2013.01); *H03F 2200/03* (2013.01); *H03F 2200/126* (2013.01); *H03F 2200/129* (2013.01); *H03F 2200/144* (2013.01); *H03F 2200/36* (2013.01); *H03F 2200/42* (2013.01); *H03F 2200/471* (2013.01)

(58) Field of Classification Search
  USPC .......................... 330/174; 381/120, 121, 122
  See application file for complete search history.

AMPLIFIER CIRCUIT FOR AMPLIFYING AN OUTPUT SIGNAL OF A CAPACITIVE SENSOR

TECHNICAL FIELD

An amplifier circuit for amplifying an output signal of a capacitive sensor is disclosed. Furthermore, a capacitive sensor arrangement comprising a capacitive sensor and an amplifier circuit for amplifying the output signal of the capacitive sensor is disclosed. Furthermore, a method for amplifying an output signal of a capacitive sensor is described.

BACKGROUND

In a MEMS capacitive sensor, for example a MEMS microphone, a capacitive profile of the sensor is changed by moving a membrane with respect to a backplate to convert an acoustical input signal into an electrical output signal of the capacitive sensor. The membrane and the backplate of the sensor form a capacitor having a variable capacitance that is changed in dependence on the distance between the membrane and the backplate of the capacitor. If the capacitive sensor is configured as a MEMS microphone, the capacitance of the capacitor of the sensor is changed in dependence on the acoustical pressure of an acoustical signal effecting on the membrane of the capacitor.

A bias voltage generator and a filter circuit are connected to a bias voltage input terminal to provide a bias voltage to the capacitive sensor. The filter provides a ripple free and noiseless bias voltage for operating the capacitive sensor. The capacitive sensor generates an output signal at an output terminal of the capacitive sensor in dependence on the distance between the membrane and the backplate of the capacitor.

The output signal generated at the output terminal of the capacitive sensor is usually amplified by an amplifier circuit comprising a capacitive sensing amplifier. The amplifier circuit is coupled to the output terminal of the capacitive sensor to receive and amplify the output signal of the capacitive sensor. In order to set an operation point of the amplifier of the amplifier circuit, a DC level of the amplifier is set to a predefined value by means of a control circuit in a feedback loop/DC servo loop. The control circuit in the feedback loop controls the input DC level of the amplifier.

A startup time of the arrangement comprising the bias voltage generator/filter circuit for providing the bias voltage, the capacitive sensor and the amplifier circuit is defined as the time until the output signal of the amplifier circuit is ready to use. The time it takes for the output to settle to its final value is referred to as the settling phase. After the arrangement has started up, the output signal if no signal is applied to the sensor has to stay within pre-defined limits.

In order to bring the capacitive sensor into a status ready for operation a bias voltage has to be applied to a bias voltage input terminal of the capacitive sensor to provide a charge at the plates of the capacitor of the capacitive sensor. After the capacitive sensor is ready for operation, the bias voltage provided at the bias voltage input terminal is settling to its final level. During the settling process, charge will be transferred by the capacitor of the capacitive sensor to the input terminal of the amplifier circuit. If the charge at the plates of the capacitor of the capacitive sensor remains constant after the settling of the bias voltage no more charge is transferred to the input terminal of the amplifier circuit. The settling of the bias voltage is influenced by the start-up characteristics of the voltage generator/filter circuit for providing the bias voltage as well as any leakage characteristics of the capacitive sensor. The settling can take several seconds before the bias voltage reaches its final bias voltage level.

For normal operation the bandwidth of the DC servo loop of the amplifier circuit is set such that it does not interfere with the bandwidth of the output signal of the capacitive sensor. In audio applications using a MEMS microphone as capacitive sensor, the bandwidth of the control circuit of the feedback loop of the amplifier circuit is required to be set in the hertz range leading to settling times in the range of seconds. For quick startup of the device the bandwidth is required to be increased. If the bandwidth of the DC servo loop is too low to compensate for the rate of change of the bias voltage level during settling, the input voltage level at the input terminal of the amplifier of the amplifier circuit will start to deviate from its final DC bias value. On the other hand, larger loop bandwidths of the control circuit of the feedback loop will reduce the bandwidth of the output signal, resulting in an increased noise level of the amplified output signal and leading to an excessive phase delay.

It is a desire to provide an amplifier circuit for amplifying an output signal of a capacitive sensor that allows to sufficiently compensate the rate of change of the bias voltage of the capacitive sensor during the settling phase.

Furthermore, there is a demand to provide a capacitive sensor arrangement comprising an amplifier circuit being configured to sufficiently compensate the rate of change of a bias voltage level of the capacitive sensor during the settling phase.

Furthermore, it is desired to provide a method to amplify an output signal of a capacitive sensor, wherein an amplifier circuit to amplify the output signal of the capacitive sensor can sufficiently compensate the rate of change of a bias voltage level of the capacitive sensor during the settling phase.

SUMMARY

An embodiment of an amplifier circuit for amplifying an output signal of a capacitive sensor is described in claim 1.

The amplifier circuit comprises a first input terminal to receive the output signal of the capacitive sensor, a second input terminal to receive a bias voltage of the capacitive sensor and an output terminal to provide an amplified output signal. The amplifier circuit further comprises an amplifier for amplifying the output signal having an input connection being coupled to the first input terminal to receive the output signal of the capacitive sensor and an output connection coupled to the output terminal of the amplifier circuit to output the amplified output signal. The amplifier circuit further comprises a feedback loop being arranged between the input connection and the output connection of the amplifier. The feedback loop comprises a control circuit being configured to control a DC voltage level at the input connection of the amplifier. The amplifier circuit further comprises a bias voltage sensing circuit coupled to the second input terminal to sense a change of the level of the bias voltage at the second input terminal of the amplifier circuit. The bias voltage sensing circuit is configured to change the bandwidth of the feedback loop in dependence on the sensed change of the level of the bias voltage.

A capacitive sensor arrangement comprising a capacitive sensor and an amplifier circuit that allows to sufficiently compensate the rate of change of the bias voltage level provided for operating the capacitive sensor is specified in claim 11.

The capacitive sensor arrangement comprises a capacitive sensor to provide an output signal and an amplifier circuit for amplifying the output signal of the capacitive sensor as specified above. The capacitive sensor is connected to the first input terminal of the amplifier circuit to provide the output signal to the first input terminal of the amplifier circuit.

A method to amplify an output signal of a capacitive sensor, wherein an amplifier circuit is provided that can sufficiently compensate the rate of change of the bias voltage level provided for operating the capacitive sensor is specified in claim 13.

The method comprises the following steps:
providing a capacitive sensor having a bias voltage input terminal to apply a bias voltage to the capacitive sensor and an output terminal to provide the output signal,
providing an amplifier circuit for amplifying the output signal of the capacitive sensor specified above,
connecting the first input terminal of the amplifier circuit to receive the output signal with the output terminal of the capacitive sensor,
connecting the second input terminal of the amplifier circuit to the bias voltage input terminal of the capacitive sensor,
applying the bias voltage to the bias voltage input terminal of the capacitive sensor,
sensing a change of the level of the bias voltage at the second input terminal of the amplifier circuit, and
changing the bandwidth of the feedback loop of the amplifier circuit in dependence on the sensed change of the level of the bias voltage.

The amplifier circuit for amplifying the output signal of the capacitive sensor comprises an adaptive (servo) feedback loop control that allows fast settling of the input DC level of the amplifier of the amplifier circuit and, furthermore, allows to compensate for settling effects of the bias voltage provided for operating the capacitive sensor. The bandwidth of the feedback loop of the amplifier circuit during the settling phase is set in dependence on the detected rate of change of the bias voltage provided for operating the capacitive sensor.

The idea is to control the bandwidth of the feedback loop of the amplifier circuit by sensing the rate of change of the bias voltage of the capacitive sensor. The amplifier circuit allows the bandwidth of the (DC servo) feedback loop to be set to its minimum required value during the settling phase and no longer needs to rely on a fixed loop bandwidth with fixed timing during the settling phase. This produces improved performance during the settling phase in relation to noise and phase, shorter start-up times and higher tolerances against leakage effects of the capacitive sensor.

For a quick start-up of the device, the bias voltage might not have fully settled to its final value. With the proposed technique the bandwidth of the feedback loop of the amplifier circuit can be adjusted to compensate for such settling effects. A gradual or continuous adjustment of the bandwidth of the feedback loop of the amplifier circuit allows for minimum performance degradation during and after the bias voltage of the capacitive sensor has settled to its final value.

Figure 1:
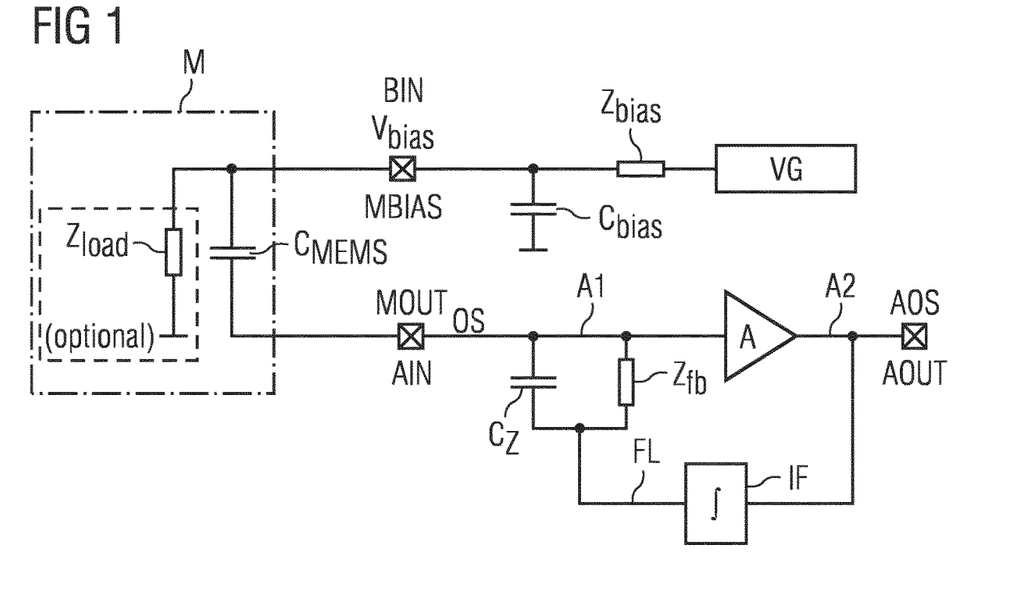
FIG. 1 shows an embodiment of a capacitive sensor arrangement comprising a capacitive sensor and an amplifier circuit to output an amplified output signal.

FIG. 1 shows a system architecture of a capacitive sensor arrangement comprising a capacitive sensor M, a voltage generator VG to provide a bias voltage Vbias for operating the capacitive sensor M and an amplifier circuit AC to provide an amplified output signal AOS at an output terminal AOUT. The capacitive sensor M comprises a capacitor $C_{MEMS}$ and, optionally, an impedance $Z_{load}$ that describes any leakage characteristics of the capacitive sensor. During operation of the capacitive sensor the capacitance of the capacitor $C_{MEMS}$ is changed by moving its membrane with respect to its backplate. If the charge Q at the plates remains constant, the voltage across the membrane and its backplate is proportional to its distance Δd given by $$\Delta V = \frac{Q * \Delta d}{\varepsilon_r * \varepsilon_r * A}$$

In order to provide the charge Q at the plates of the capacitor $C_{MEMS}$, the voltage generator VG provides a bias voltage Vbias at a bias voltage input terminal MBIAS of the capacitive sensor M. The voltage generator VG may be configured as a charge pump which generates the bias voltage from an internal voltage reference. A filter circuit comprising the impedance $Z_{bias}$ and a capacitor $C_{bias}$ is provided between the voltage generator VG and the bias voltage input terminal MBIAS to provide a ripple free and noiseless copy of the voltage generator's output voltage. In dependence on the current distance Δd between the membrane and the backplate, the capacitive sensor generates an output signal OS at an output terminal MOUT of the capacitive sensor M.

The amplifier circuit AC comprises an amplifier A which is connected between an input terminal AIN of the amplifier circuit and an output terminal AOUT of the amplifier circuit. The input terminal AIN of the amplifier circuit AC is connected to the output terminal MOUT of the capacitive sensor. The amplifier circuit further comprises a feedback loop/DC servo loop FL to control the input DC level of the capacitive sensing amplifier A. The feedback loop FL comprises an integrating component IF forming a high-pass filter transfer characteristic. To sustain a high impedance node at an input connection A1 of the amplifier A, an anti-parallel pair of diodes $Z_{fb}$ is used to set the input DC bias voltage level of the amplifier A of the amplifier circuit AC. This forms a low pass filter requiring a stabilizing zero-capacitance $C_Z$ to be placed across the diodes $Z_{fb}$.

Figure 2:
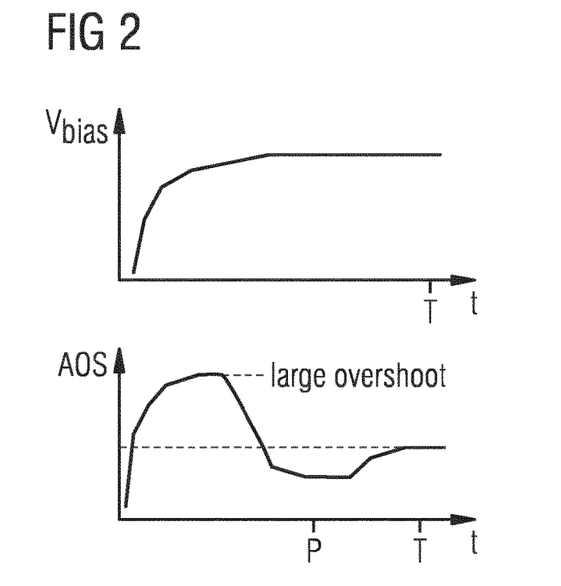
FIG. 2 shows diagrams of a course of a bias voltage of a capacitive sensor and an amplified output signal of an amplifier circuit of a capacitive sensor arrangement during a settling phase.

FIG. 2 shows the course of the bias voltage Vbias and the amplified output signal AOS provided by the amplifier circuit AC at the output terminal AOUT during the settling phase of the capacitive sensor. The voltage generator VG causes the capacitive sensor M to "start-up" by providing and applying the bias voltage Vbias to the bias voltage input terminal MBIAS. The voltage generator VG generates and provides the bias voltage Vbias from the beginning of the settling phase at the time t=0. The voltage generator VG generates the bias voltage Vbias such that the bias voltage settles during a settling time T defining the time duration of the settling phase to its final level. The settling of the bias voltage Vbias is shown in the first diagram of FIG. 2. The time it takes the bias voltage Vbias to settle to its final value depends on the leakage characteristics of the capacitive sensors, the settling time of the voltage generator VG as well as the charging time of the capacitor $C_{bias}$ through the load $Z_{bias}$. The settling time T being necessary to settle the bias voltage Vbias to its final level can take several seconds. During the settling process, charge will be transferred by the MEMS capacitor $C_{CMEMS}$ to the input terminal AIN of the amplifier circuit AC.

According to the embodiment of the capacitive sensor arrangement shown in FIG. 1, the feedback loop FL has a fixed loop bandwidth. For normal operation, the bandwidth of the feedback loop FL is set such that it does not interfere with the bandwidth of the output signal OS provided by the capacitive sensor M at the output terminal MOUT. In audio applications the bandwidth of the feedback loop FL is required to be set in the hertz range leading to settling times of the amplifier circuit AC in the range of seconds.

The fixed bandwidth of the feedback loop FL optimized for a later application, for example for using the amplifier circuit coupled to a MEMS microphone, is usually too low to compensate for the rate of change of the level of the bias voltage Vbias so that the DC input voltage level of the amplifier A will start to deviate from its final DC bias level. As a consequence, the output voltage AOS at the output terminal AOUT of the amplifier circuit shows a large variation with a large overshoot during the settling phase before the bias voltage Vbias reaches its final level as shown in FIG. 2.

Figure 3:
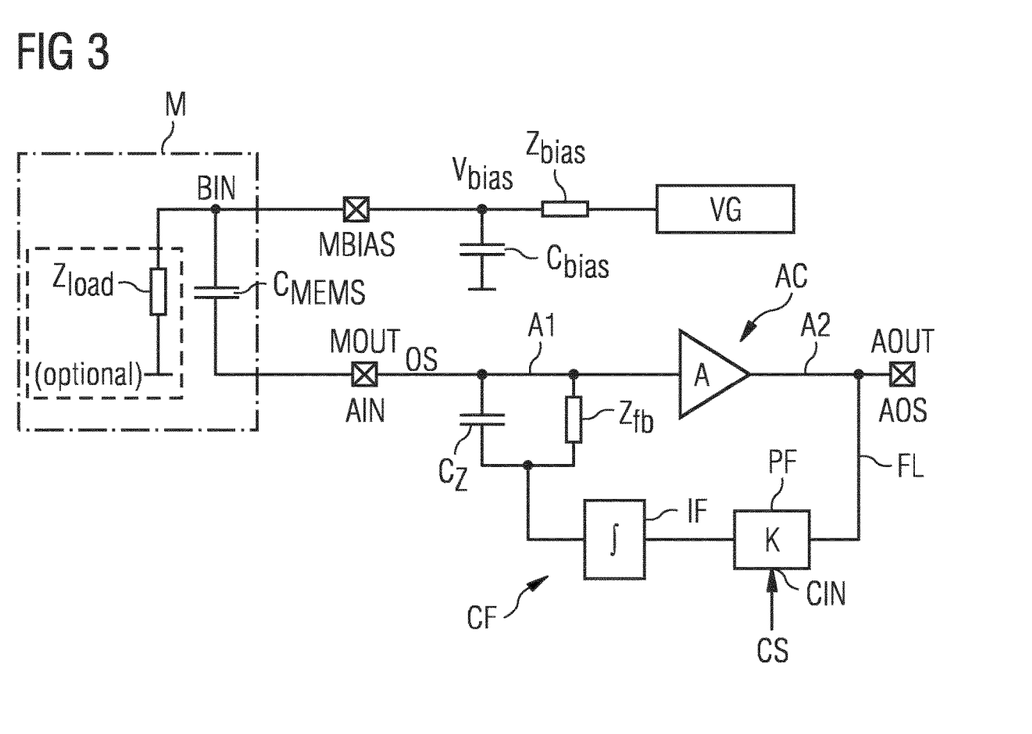
FIG. 3 shows an embodiment of a capacitive sensor arrangement comprising a capacitive sensor and an amplifier circuit to output an amplified output signal.

FIG. 3 shows another embodiment of a capacitive sensor arrangement. The arrangement comprises the capacitive sensor M, the bias voltage generator VG to generate the bias voltage Vbias at the bias voltage input terminal MBIAS of the capacitive sensor M and the amplifier circuit AC to amplify the output signal OS of the capacitive sensor M. The capacitive sensor M provides the output signal OS at the output terminal MOUT of the capacitive sensor. The amplifier circuit AC has an input terminal AIN to be coupled to the output terminal MOUT of the capacitive sensor M to receive the output signal OS of the capacitive sensor and an output terminal AOUT to provide an amplified output signal AOS.

The voltage generator VG is coupled via a filter comprising the impedance $Z_{bias}$ and the capacitor $C_{bias}$ to the bias voltage input terminal MBIAS of the capacitive sensor. The capacitive sensor M comprises the capacitor $C_{MEMS}$ having a variable capacitance and optionally an impedance $Z_{load}$ that is responsible for the leakage characteristics of the capacitive sensor M. The capacitive sensor M may be configured as a MEMS microphone.

The amplifier circuit AC comprises the amplifier A to amplify the output signal OS received from the capacitive sensor M at the input terminal AIN of the amplifier circuit and to generate an amplified output signal AOS at the output terminal AOUT. As already shown in FIG. 1, the amplifier circuit AC comprises the feedback loop/DC servo loop FL that is arranged between an input connection A1 of the amplifier A and an output connection A2 of the amplifier A. The feedback loop comprises an impedance $Z_{fb}$ that may be configured as an anti-parallel pair of diodes used to set the input DC bias voltage of the amplifier A and a stabilizing zero-capacitance $C_Z$ to be placed across the impedance $Z_{fb}$. The feedback loop FL further comprises a control circuit CF being configured to control a DC voltage level at the input connection A1 of the amplifier A. The control circuit CF comprises an integrating component IF and a proportional element PF. The proportional element PF is connected between the output connection A2 of the amplifier A and the integrating element IF. The integrating element IF is arranged in the feedback loop FL between the proportional element PF and the low pass filter comprising the impedance $Z_{fb}$ and the capacitance $C_Z$.

Figure 4:
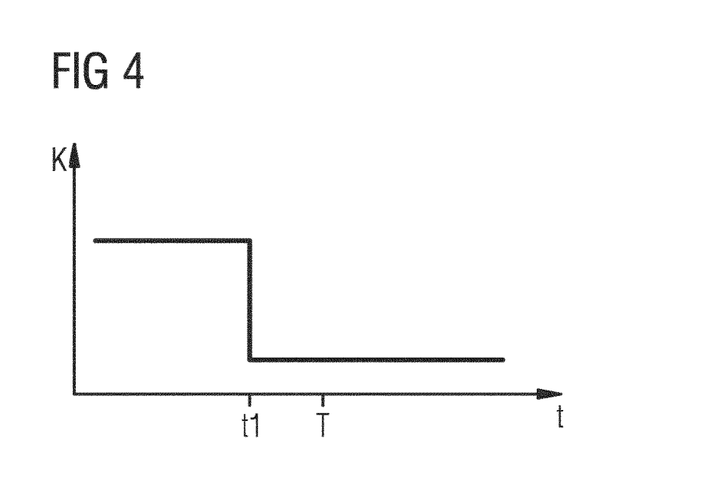
FIG. 4 illustrates the modification of a gain during a settling phase of a capacitive sensor.

In contrast to the embodiment of the capacitive sensor arrangement shown in FIG. 1, the feedback loop FL additionally comprises the proportional element PF having a variable gain/amplification factor K. The proportional element PF comprises a control terminal CIN to apply a control signal CS to set the gain/amplification factor K as shown in FIG. 4.

During the settling phase during which the level of the bias voltage Vbias settles to its final level at the time T, the gain K of the proportional element PF may be digitally controlled by the control signal CS and is reduced from a higher starting level at the beginning of the settling phase to a lower final level at a predefined time t1 during the settling phase or next to/at the end of the settling phase. This technique allows to increase the bandwidth of the feedback loop FL to an increased but fixed value during the settling phase that allows faster settling as compared with the embodiment of the capacitive sensor arrangement shown in FIG. 1. The increased bandwidth of the feedback loop FL set by means of the higher gain/amplification factor K during the settling phase, is reduced after a fixed time t1 during the settling phase to a lower bandwidth that does not interfere with the bandwidth of the output signal OS of the capacitive sensor during later normal operation.

Figure 5:
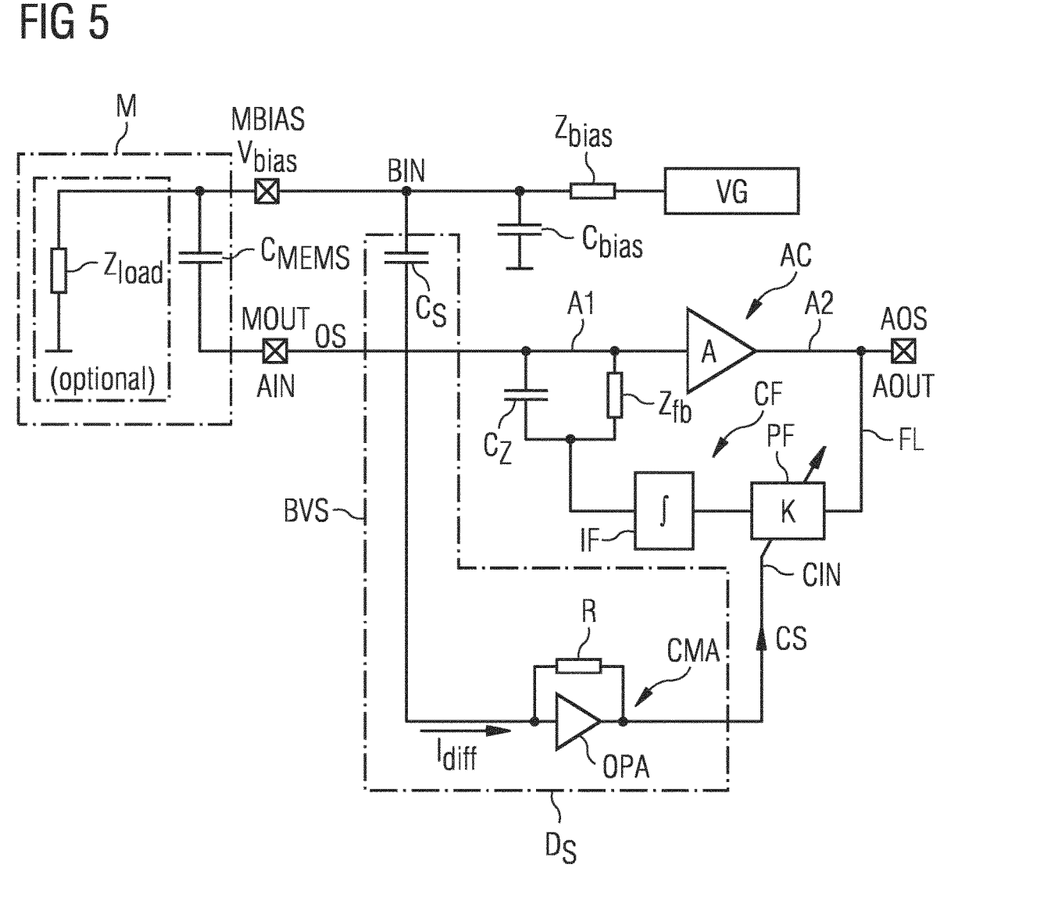
FIG. 5 shows an embodiment of a capacitive sensor arrangement comprising a capacitive sensor and an amplifier circuit to output an amplified output signal with an adaptive control of the bandwidth of a feedback loop of the amplifier circuit.

FIG. 5 shows an improved embodiment of a capacitive sensor arrangement comprising an adaptive control mechanism to continuously control and adapt the bandwidth of the feedback loop FL during the settling phase to the current amount/rate of the change of the level of the bias voltage Vbias. The capacitive sensor arrangement comprises the capacitive sensor M to provide the output signal OS at the output terminal MOUT of the capacitive sensor and a bias voltage generator VG to provide the bias voltage Vbias for operating the capacitive sensor M. The capacitive sensor M comprises a bias voltage input terminal MBIAS to apply the bias voltage Vbias. The bias voltage generator VG is connected to the bias voltage input terminal MBIAS of the capacitive sensor M. A filter comprising the impedance $Z_{bias}$ and the capacitance $C_{bias}$ may be coupled between the voltage generator VG and the bias voltage input terminal MBIAS to prevent that disturbing signals are applied to the bias voltage input terminal MBIAS. The capacitive sensor M comprises the capacitance $C_{MEMS}$ having a variable capacitance and, optionally, an impedance $Z_{load}$ that describes any leakage characteristics of the capacitive sensor. The capacitive sensor may be configured as a MEMS microphone.

The amplifier circuit AC comprises the input terminal AIN to receive the output signal OS of the capacitive sensor M. The capacitive sensor M is connected with its output terminal MOUT to provide the output signal OS to the input terminal AIN of the amplifier circuit AC. The amplifier circuit AC further comprises an input terminal BIN to receive and monitor the bias voltage Vbias supplied by the bias voltage generator VG. The input terminal BIN of the amplifier circuit AC is connected to the bias voltage input terminal MBIAS of the capacitive sensor M. The amplifier circuit AC further comprises the amplifier A for amplifying the output signal OS having an input connection A1 being coupled to the input terminal AIN of the amplifier circuit to receive the output signal OS of the capacitive sensor and an output connection A2 coupled to the output terminal AOUT to output the amplified output signal AOS.

The amplifier circuit AC further comprises a feedback loop/DC servo loop FL being arranged between the input connection A1 and the output connection A2 of the amplifier A. The feedback loop FL comprises a control circuit CF being configured to control a DC voltage level at the input connection A1 of the amplifier A. The amplifier circuit AC further comprises a bias voltage sensing circuit BVS coupled to the input terminal BIN to sense/determine a change of the level of the bias voltage Vbias at the input terminal BIN. In particular, the bias voltage sensing circuit BVS is configured to detect a rate/amount of the change of the level of the bias voltage Vbias. The bias voltage sensing circuit BVS is configured to change the bandwidth of the feedback loop FL/control circuit CF in dependence on the determined change of the level of the bias voltage Vbias.

The bias voltage sensing circuit BVS is configured to change the bandwidth of the feedback loop FL/control circuit CF such that the feedback loop FL/control circuit CF is operated with a first/nominal value of the bandwidth, if no change of the level of the bias voltage Vbias is detected by the voltage sensing circuit BVS. The bias voltage sensing circuit BVS is configured to change the bandwidth of the feedback loop FL/control circuit CF such that the feedback loop FL/control circuit CF is operated with a second value of the bandwidth being larger than the first value of the bandwidth, if a change of the level of the bias voltage Vbias is detected by the bias voltage sensing circuit BVS.

The bias voltage sensing circuit BVS is configured to change the bandwidth of the feedback loop FL/control circuit CF such that the feedback loop FL/control circuit CF is operated with the second value of the bandwidth, if the bias voltage sensing circuit BVS detects a first amount of the change of the level of the bias voltage Vbias. The bias voltage sensing circuit BVS is configured to change the bandwidth of the feedback loop FL/control circuit CF such that the feedback loop FL/control circuit CF is operated with a third value of the bandwidth being larger than the second value of the bandwidth, if the bias voltage sensing circuit BVS detects a second amount of the change of the level of the bias voltage Vbias being higher than the first amount of the change of the level of the bias voltage.

According to an embodiment of the amplifier circuit, the bias voltage sensing circuit BVS is configured to change the bandwidth of the feedback loop FL/control circuit CF such that the bandwidth of the feedback loop FL/control circuit CF is gradually or continuously changed in dependence on the amount of the change of the bias voltage Vbias detected by the bias voltage sensing circuit BVS. That means that the bandwidth of the feedback loop FL/control circuit CF may be changed continuously between the third/second value and the nominal first value of the bandwidth in dependence on the detected amount/rate of change of the level of the bias voltage Vbias.

According to an embodiment of the amplifier circuit, the control circuit CF comprises a control connection CIN to apply a control signal CS to change the bandwidth of the feedback loop FL/control circuit CF. The bias voltage sensing circuit BVS is configured to generate and apply the control signal CS to change the bandwidth of the feedback loop FL/control circuit CF to the control connection CIN.

According to an embodiment of the amplifier circuit, the bias voltage sensing circuit BVS comprises a differentiating element $D_S$ for measuring/detecting a change of the bias voltage Vbias at the input terminal BIN. The bias voltage sensing circuit generates the control signal CS to change the bandwidth of the feedback loop FL/control circuit CF in dependence on the amount of the detected change of the bias voltage Vbias at the input terminal BIN.

According to an embodiment of the amplifier circuit, the differentiating element $D_S$ of the bias voltage sensing circuit BVS comprises a capacitor $C_S$ coupled to the input terminal BIN. The differentiating element $D_S$ of the bias voltage sensing circuit BVS further comprises an operational amplifier OPA and a resistor R fed back from the output side of the operational amplifier to the input side of the operational amplifier OPA. The operational amplifier is coupled in series with the capacitor $C_S$ and is connected to the control connection CIN of the control circuit CF. The differentiating element $D_S$ is configured to detect the change of the bias voltage Vbias at the input terminal BIN and to generate the control signal CS in dependence on the detected change of the bias voltage.

According to an embodiment of the amplifier circuit, the control circuit CF may comprise a proportional-integral controller PI. The proportional-integral controller PI may comprise a proportional element PF and an integrating element IF coupled in series to each other. The control circuit CF is configured such that the value of the bandwidth of the feedback loop FL/control circuit CF is controllable by changing a gain/amplification factor K of the proportional element PF of the proportional-integral controller PI. The proportional-integral controller PI may be configured such that the gain factor K of the proportional element PF of the proportional-integral controller PI is changeable in dependence on the control signal CS.

Figure 6:
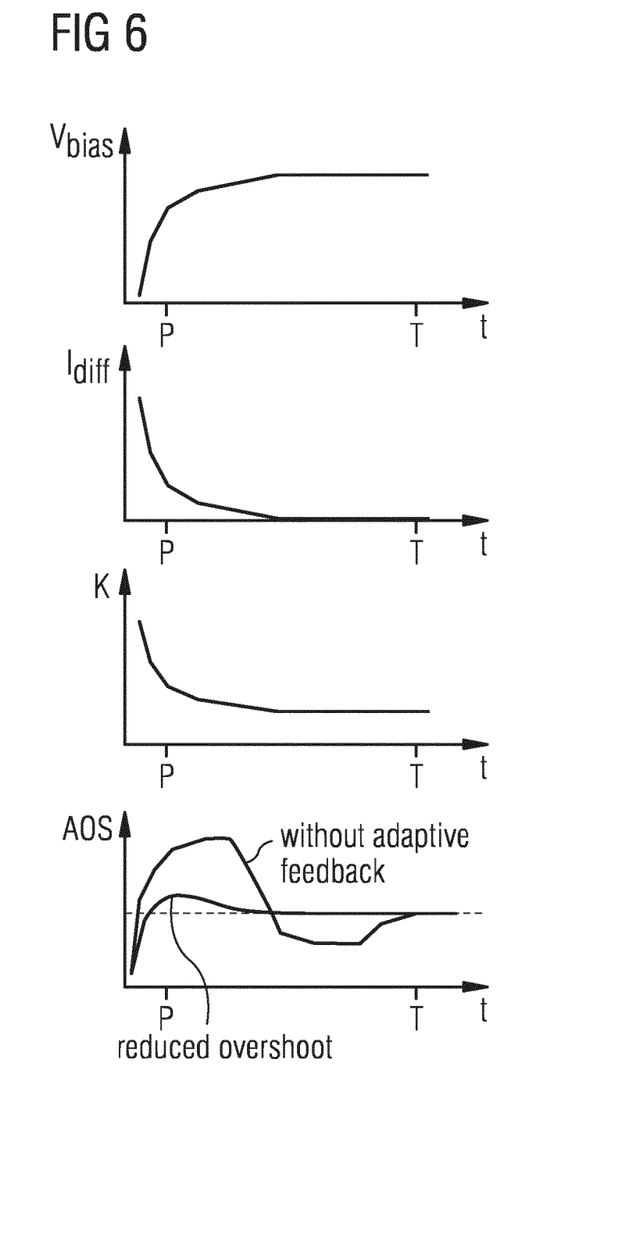
FIG. 6 shows courses of a bias voltage, a current caused by bias voltage variations, a gain of a proportional element of a controller and an output signal of an amplifier circuit during a settling phase of the capacitive sensor.

FIG. 6 illustrates the function of the capacitive sensor arrangement being equipped with the adaptive control of the bandwidth of the feedback loop FL/control circuit CF that continuously adapts the bandwidth of the control circuit in dependence on the detected change of the level of the bias voltage Vbias. After turning on the capacitive sensor M, the bias voltage Vbias provided by the voltage generator VG at the bias voltage input terminal MBIAS settles during the settling phase and reaches its final level at the time T at the end of the settling phase. To compensate for settling effects of the bias voltage of the capacitive sensor during the settling phase, the bandwidth of the feedback loop FL/control circuit CF is adaptively adjusted by sensing the rate of change of the level of the bias voltage Vbias at the input terminal BIN. According to the embodiment of the amplifier circuit AC shown in FIG. 5, the bias voltage sensing circuit BVS detects an amount/rate of the change of the bias voltage Vbias, i.e. an increase of the level of the bias voltage Vbias at the input terminal BIN during the settling phase.

The bias voltage sensing circuit BVS is configured to generate the control signal CS to control the gain/amplification factor K of the proportional element PF of the control circuit CF in the feedback loop FL such that gain/amplification factor K is increased, if the bias voltage sensing circuit detects a large or fast change of the level of the bias voltage Vbias. If the detected amount of the change of the level of the bias voltage Vbias decreases, the bias voltage sensing circuit BVS generates the control signal CS to control the gain/amplification factor K of the proportional element such that the gain/amplification factor K is reduced. The change of the gain/amplification factor K is controlled so that the factor K can be continuously/gradually changed.

After the settling of the bias voltage Vbias has finished at the end of the settling phase at time T or a constant level of the bias voltage Vbias is detected at the terminal BIN, the control signal CS is generated by the bias voltage sensing circuit BVS such that the gain/amplification factor K of the proportional element PF is set to a low and constant value. If the bias voltage sensing circuit BVS detects a constant level of the bias voltage Vbias, the gain/amplification factor K is generated with a minimum constant (nominal) level.

The bandwidth of the feedback loop FL/control circuit CF is set to a larger value at the beginning of the settling phase when a large amount of change of the bias voltage Vbias is detected by the bias voltage sensing circuit BVS. At the end of the settling phase, when the bias voltage sensing circuit BVS detects only a low rate of change of the level of the bias voltage Vbias and thus detects the settling of the bias voltage Vbias to its final value, the bandwidth of the feedback loop FL/control circuit CF is reduced to a nominal value that is chosen such that it does not interfere with the signal bandwidth of the output signal OS of the capacitive sensor M.

The embodiment of the capacitive sensor arrangement shown in FIG. 5 comprising the adaptive control of the bandwidth of the control circuit CF/the feedback loop FL allows to set the bandwidth of the control circuit CF/the feedback loop FL such that the loop can sufficiently compensate the rate of change of the sensor's bias settling. By monitoring the bias voltage Vbias of the capacitive sensor M, the bandwidth of the feedback loop FL can be gradually or continuously adjusted for optimum signal bandwidth, phase delay and noise performance. Only after the bias voltage Vbias of the capacitive sensor M has sufficiently settled, will the bandwidth of the feedback loop be reduced to its nominal value such that it does not interfere with the bandwidth of the output signal OS of the capacitive sensor.

As shown in FIG. 6 in the last diagram, the output signal AOS being amplified by the amplifier circuit AC shows a large overshoot during the start-up phase caused by the change of the level of the bias voltage Vbias, if an amplifier circuit AC without an adaptive feedback loop is used. On the other hand, FIG. 6 shows that the amplified output signal AOS has a reduced overshoot, if the amplifier circuit AC with the adaptive control of the bandwidth of the control circuit CF/the feedback loop FL, as shown in FIG. 5, is used. A time P specifying the startup time in the diagrams of FIGS. 2 and 6 may be reduced, as illustrated in FIG. 6, if the adaptive control of the bandwidth of the feedback loop FL/control circuit CF in dependence on the detected change of the bias voltage Vbias is used, in comparison to the startup time P illustrated in FIG. 2 which relates to the circuit arrangement shown in FIG. 1.

The embodiment of the capacitive sensor arrangement illustrated in FIG. 5 shows the bias voltage sensing circuit BVS being configured as an analog circuit. According to another embodiment of the capacitive sensor arrangement and especially of the amplifier circuit AC, the bias voltage sensing circuit BVS may be implemented by digital components. The embodiment of the amplifier A is not limited to an amplifier having a single-ended input terminal and a single-ended output terminal, as shown in FIG. 5. According to another embodiment, the amplifier A may be configured as an amplifier having a single-ended input terminal and a differential output terminal.

According to the embodiment of the capacitive sensor arrangement illustrated in FIG. 5, the capacitive sensor M may be embodied as an analog microphone, for example an analog MEMS microphone. It is also possible to use a digital microphone having an analog input and a digital output. In the case of a digital output of a capacitive sensor, the feedback loop FL can be implemented by digital components, such as a digital integrating element and a digital proportional element. In this case, the feedback loop FL further comprises a D/A converter to convert the digital signal at the output of the digital integrating component to an analog signal being applied via the input filter comprising the capacitor $C_Z$ and the diodes $Z_{fb}$ to the input connection A1 of the analog amplifier A. An A/D converter may be arranged at the output connection A2 of the amplifier A to provide a digital output signal.

According to the embodiment of the capacitive sensor arrangement and especially the amplifier circuit AC, the control circuit CF in the feedback loop may be configured as a proportional-integral controller PI. According to another embodiment of the amplifier circuit AC, the feedback loop may comprise a proportional-integral-differential controller (PID) or any other second order or higher order system.

The amplifier circuit AC allows to compensate the rate of change of the bias voltage Vbias for biasing the capacitive sensor not only during the settling phase of the bias voltage Vbias. Since the adaptive control mechanism is active all the time, any disturbing signal changing the level of the bias voltage Vbias during normal operation of the capacitive sensor is compensated by adjusting the bandwidth of the feedback loop FL/control circuit CF.

LIST OF REFERENCE SIGNS

M capacitive sensor
VG voltage generator for generating the bias voltage
AC amplifier circuit
A amplifier
FL feedback loop
BVS bias voltage sensing circuit
$D_S$ differentiating element
CS control circuit
IF integrating element
PF proportional element
CS control signal
AIN first input terminal
BIN second input terminal
AOS output signal
OUT output terminal of the amplifier circuit

The invention claimed is:

1. Amplifier circuit for amplifying an output signal of a capacitive sensor, comprising:
a first input terminal to receive the output signal of the capacitive sensor,
a second input terminal to receive a bias voltage of the capacitive sensor,
an output terminal to provide an amplified output signal,
an amplifier for amplifying the output signal having an input connection being coupled to the first input terminal to receive the output signal and an output connection coupled to the output terminal to output the amplified output signal,
a feedback loop being arranged between the input connection and the output connection of the amplifier, wherein the feedback loop comprises a control circuit being configured to control a DC voltage level at the input connection of the amplifier, a bias voltage sensing circuit coupled to the second input terminal to sense a change of the level of the bias voltage at the second input terminal, wherein the bias voltage sensing circuit is configured to change the bandwidth of the feedback loop in dependence on the sensed change of the level of the bias voltage.

2. The amplifier circuit of claim 1, wherein the bias voltage sensing circuit is configured to change the bandwidth of the feedback loop such that the feedback loop is operated with a first value of the bandwidth, if no change of the level of the bias voltage is detected by the voltage sensing circuit, wherein the bias voltage sensing circuit is configured to change the bandwidth of the feedback loop such that the feedback loop is operated with a second value of the bandwidth being larger than the first value of the bandwidth, if the change of the level of the bias voltage is detected by the bias voltage sensing circuit.

3. The amplifier circuit of claim 1, wherein the bias voltage sensing circuit is configured to change the bandwidth of the feedback loop such that the feedback loop is operated with a second value of the bandwidth, if the bias voltage sensing circuit detects a first amount of the change of the level of the bias voltage, wherein the bias voltage sensing circuit is configured to change the bandwidth of the feedback loop such that the feedback loop is operated with a third value of the bandwidth being larger than the second value of the bandwidth, if the bias voltage sensing circuit detects a second amount of the change of the level of the bias voltage being higher than the first amount of the change of the level of the bias voltage.

4. The amplifier circuit of claim 1, wherein the bias voltage sensing circuit is configured to change the bandwidth of the feedback loop such that the bandwidth of the feedback loop is gradually changed in dependence on the amount of the change of the bias voltage detected by the bias voltage sensing circuit.

5. The amplifier circuit of claim 1, wherein the control circuit comprises a control connection to apply a control signal to change the bandwidth of the feedback loop, wherein the bias voltage sensing circuit is configured to generate and apply the control signal to change the bandwidth of the feedback loop to the control connection.

6. The amplifier circuit of claim 5, wherein the bias voltage sensing circuit comprises a differentiating element for measuring an amount of a change of the bias voltage at the second input terminal, wherein the bias voltage sensing circuit generates the control signal to change the bandwidth of the feedback loop in dependence on the amount of the change of the bias voltage at the second input terminal.

7. The amplifier circuit of claim 1, wherein the control circuit comprises a proportional-integral controller.

8. The amplifier circuit of claim 7, wherein the proportional-integral controller comprises a proportional element and an integrating element coupled in series to each other, wherein the control circuit is configured such that the value of the bandwidth of the feedback loop is controllable by changing a gain factor of the proportional component of the proportional-integral controller.

9. The amplifier circuit of claim 8, wherein the proportional-integral controller is configured such that the gain factor of the proportional element of the proportional-integral controller is changeable in dependence on the control signal.

10. A capacitive sensor arrangement, comprising:

a capacitive sensor to provide an output signal, an amplifier circuit for amplifying the output signal of the capacitive sensor of claim 1, wherein the capacitive sensor is connected to the first input terminal of the amplifier circuit to provide the output signal to the first input terminal of the amplifier circuit.

11. The capacitive sensor arrangement of claim 10, comprising:

a bias voltage generator to provide a bias voltage for operating the capacitive sensor, wherein the capacitive sensor comprises a bias voltage input terminal to apply the bias voltage, wherein the bias voltage generator is connected to the bias voltage input terminal of the capacitive sensor, wherein the second input terminal of the amplifier circuit is connected to the bias voltage input terminal of the capacitive sensor.

12. The capacitive sensor arrangement of claim 10 or 11, wherein the capacitive sensor is configured as a microphone.

13. A method for amplifying an output signal of a capacitive sensor, comprising:

providing a capacitive sensor having a bias voltage input terminal to apply a bias voltage to the capacitive sensor and an output terminal to provide the output signal, providing an amplifier circuit for amplifying the output signal of the capacitive sensor of claim 1, connecting the first input terminal of the amplifier circuit to receive the output signal with the output terminal of the capacitive sensor, connecting the second input terminal of the amplifier circuit to the bias voltage input terminal of the capacitive sensor, applying the bias voltage to the bias voltage input terminal of the capacitive sensor, sensing a change of the level of the bias voltage at the second input terminal of the amplifier circuit, changing the bandwidth of the feedback loop of the amplifier circuit in dependence on the sensed change of the level of the bias voltage.

14. The method of claim 13, comprising:

gradually changing the bandwidth of the feedback loop of the amplifier circuit in dependence on the level of the change of the bias voltage detected by the bias voltage sensing circuit of the amplifier circuit.

15. The method of claim 13, comprising:

changing the bandwidth of the feedback loop of the amplifier circuit such that the feedback loop is operated with a first value of the bandwidth, if no change of the level of the bias voltage is detected by the bias voltage sensing circuit of the amplifier circuit, changing the bandwidth of the feedback loop of the amplifier circuit such that the feedback loop is operated with a second value of the bandwidth being larger than the first value of the bandwidth, if the bias voltage sensing circuit of the amplifier circuit detects a first amount of the change of the level of the bias voltage, changing the bandwidth of the feedback loop of the amplifier circuit such that the feedback loop is operated with a third value of the bandwidth being larger than the second value of the bandwidth, if the bias voltage sensing circuit detects a second amount of the change of the level of the bias voltage being larger than the first amount of the change of the level of the bias voltage.

* * * * *